(12) United States Patent
Huat et al.

(10) Patent No.: US 7,786,554 B2
(45) Date of Patent: Aug. 31, 2010

(54) STRESS-FREE LEAD FRAME

(75) Inventors: Lee Kock Huat, Ipoh (MY); Chan Boon Meng, Ipoh (MY); Cheong Mun Tuck, Ipoh (MY); Lee Huan Sin, Melaka (MY); Phuah Kian Keung, Ipoh (MY); Araventhan Eturajulu, Ipoh (MY); Liow Eng Keng, Ipoh (MY); Thum Min Kong, Perak (MY); Chen Choon Hing, Perak (MY)

(73) Assignee: Carsem (M) Sdn. Bhd., Kuala Lumpur (MY)

( * ) Notice: Subject to any disclaimer, the term of this patent is extended or adjusted under 35 U.S.C. 154(b) by 171 days.

(21) Appl. No.: 11/868,294

(22) Filed: Oct. 5, 2007

(65) Prior Publication Data

US 2008/0023806 A1 Jan. 31, 2008

Related U.S. Application Data

(60) Division of application No. 11/022,071, filed on Dec. 23, 2004, now Pat. No. 7,288,833, which is a continuation of application No. 09/909,934, filed on Jul. 20, 2001, now Pat. No. 6,867,483.

(30) Foreign Application Priority Data

Sep. 13, 2000 (MY) .............................. PI 2000 4237

(51) Int. Cl.
*H01L 23/495* (2006.01)

(52) U.S. Cl. ........................ 257/669; 257/670; 257/672; 257/E23.05

(58) Field of Classification Search ................. 257/666, 257/669, 670, 672, E23.043, E23.046, E23.05
See application file for complete search history.

(56) References Cited

U.S. PATENT DOCUMENTS

| 3,778,887 A | 12/1973 | Suzuki et al. |
| 5,023,202 A | 6/1991 | Long et al. |
| 5,057,901 A | 10/1991 | Abel et al. |
| 5,122,860 A | 6/1992 | Kikuchi et al. |
| 5,134,773 A | 8/1992 | LeMaire et al. |

(Continued)

FOREIGN PATENT DOCUMENTS

JP            63-033854            2/1988

(Continued)

*Primary Examiner*—Matthew E Warren
(74) *Attorney, Agent, or Firm*—Townsend and Townsend and Crew LLP

(57) ABSTRACT

The present invention relates to a stress-free lead frame (1) for a semiconductor. The stress-free lead frame (1) is provided with a stress-relief means (15) and an interlocking means (16) at the outer periphery. The stress-relief means (15) is capable of accommodating expansion and compression while the interlocking means (16) take care of shock and vibration during handling to thereby eliminate delamination of the lead frame (10).

11 Claims, 2 Drawing Sheets

U.S. PATENT DOCUMENTS

| | | | |
|---|---|---|---|
| 5,172,214 A | 12/1992 | Casto | |
| 5,417,905 A | 5/1995 | LeMaire et al. | |
| 5,452,511 A | 9/1995 | Chang | |
| 5,637,913 A | 6/1997 | Kaijara et al. | |
| 5,661,086 A | 8/1997 | Nakashima et al. | |
| 5,793,100 A | 8/1998 | Takahashi | |
| 5,838,062 A | 11/1998 | Hwang et al. | |
| 5,854,740 A | 12/1998 | Cha | |
| 5,854,741 A | 12/1998 | Shim et al. | |
| 5,869,353 A | 2/1999 | Levy et al. | |
| 5,920,113 A | 7/1999 | Chee et al. | |
| 5,942,794 A | 8/1999 | Okumura et al. | |
| 6,043,109 A | 3/2000 | Yang et al. | |
| 6,091,134 A | 7/2000 | Sakamoto et al. | |
| 6,107,690 A | 8/2000 | Courtenay et al. | |
| 6,130,473 A | 10/2000 | Mostafazadeh et al. | |
| 6,137,160 A | 10/2000 | Ishikawa | |
| 6,143,981 A | 11/2000 | Glenn | |
| 6,215,177 B1 | 4/2001 | Corisis et al. | |
| 6,229,200 B1 | 5/2001 | Mclellan et al. | |
| 6,242,281 B1 | 6/2001 | Mclellan et al. | |
| 6,281,568 B1 | 8/2001 | Glenn et al. | |
| 6,369,439 B1 * | 4/2002 | Tao et al. | 257/666 |
| 6,372,543 B1 | 4/2002 | Chiu et al. | |
| 6,377,742 B1 | 4/2002 | Go | |
| RE37,690 E | 5/2002 | Kitano et al. | |
| 6,433,277 B1 | 8/2002 | Glenn | |
| 6,455,356 B1 | 9/2002 | Glenn et al. | |
| 6,483,177 B1 | 11/2002 | Yee | |
| 6,521,987 B1 | 2/2003 | Glenn et al. | |
| 6,563,201 B1 | 5/2003 | Goiz | |
| 6,630,728 B2 | 10/2003 | Glenn | |
| 6,684,496 B2 * | 2/2004 | Glenn | 29/841 |
| 6,867,072 B1 | 3/2005 | Shiu et al. | |
| 6,885,086 B1 | 4/2005 | Fogelson et al. | |
| 6,917,097 B2 | 7/2005 | Chow et al. | |

FOREIGN PATENT DOCUMENTS

| | | |
|---|---|---|
| JP | 63-188964 | 8/1988 |
| JP | 63-289951 | 11/1988 |
| JP | 01-106456 A | 4/1989 |
| JP | 02-129948 A | 5/1990 |
| JP | 03-69248 | 7/1991 |
| JP | 06-092076 A | 4/1994 |

* cited by examiner

STRESS-FREE LEAD FRAME

CROSS-REFERENCES TO RELATED APPLICATIONS

This application is a division of U.S. application Ser. No. 11/022,071, filed Dec. 23, 2004; which is a continuation of U.S. application Ser. No. 09/909,934, filed Jul. 20, 2001, entitled "Stress-Free Lead Frame," having Lee Kock Huat et al. listed as coinventors. The disclosures of U.S. Pat. Nos. 11/022,071 and 09/909,934 are herein incorporated herein by reference in their entirety.

FIELD OF THE INVENTION

The present invention relates generally to a lead frame, especially to a stress-free lead frame for semiconductor provided with a stress-relief means and an interlocking means for eliminating delamination of leads during packaging.

BACKGROUND OF THE INVENTION

The process of manufacturing semiconductor devices involves several steps whereby an integrated circuit chip is bonded to a foil-type lead frame and encapsulated in epoxy or other moulded resin. The lead frame comprises of a plurality of leads etched or stamped out of a thin metallic foil sheet, and the inner ends of the leads are usually bonded to the solder bumps of the integrated circuit chip by a thermal compression method. The chip is then encapsulated in plastic by a transfer moulding process that results in a chip package having the outer ends of the leads expose to the outside for connection to a circuit board.

In a typical prior art system for bonding and encapsulating integrated circuits, a plurality of such circuits is linearly arranged in a single workpiece, which contains a series of identical lead frames etched or stamped on a strip of metallic substrate. A chip is bonded to each of the pre-manufactured lead frames and they are loaded to a bottom mould with the number of lead frames in a single batch being determined by the mould size and the capacity of the moulding equipment being used. A top mould is moved into place atop the bottom mould and some means is provided within the moulding equipment to heat the moulds to a proper moulding temperature, and to subsequently cool them for curing purposes. The heated moulds are clamped together by the moulding equipment and when the temperature is right, usually at approximately 175° C., the moulding material such as epoxy in pellet form is placed in the mould set through pots formed either in the top or bottom mould. Plungers are then inserted into the pots of the mould and a pressurizing force is applied to the plungers. The combination of the pressurizing force and the heat causes the epoxy pellets to liquify and flow into cavities provided in the mould set, which determines the configuration and the location of the moulded plastic that encapsulate the integrated circuits. Upon completion of this step, the mould set is cooled to induce curing to the epoxy, then the plungers are pulled from the mould set, the mould set is unclamped, and the top mould is lifted from the bottom mould. The lead frames are then removed from the bottom mould and the next station may be trimming, forming, sawing and otherwise operations on them to finish fabrication of the electronic circuit packages. Typically the outer leads of each package need to be bent (formed) to conform to requirements of the printed circuit board for which they are designed.

Delamination, that is separation of the metal lead frame from the moulded epoxy has been reported to happen during handling of the MLP. This is undesirable as it will cause damage and thus render the MLP a reject.

The moulding step also subjects the lead frame to tremendous structural stresses caused by the difference in expansion and compression of the moulded metallic foil that the lead frame and the unmoulded metallic foil that is its outer periphery. This causes bending, waving and twisting of the leads, resulting in delamination of the leads or separation of the metallic lead frame and the epoxy which will results in reliability failure of the package.

Therefore there exists a need for an improved lead frame design that may eliminate delamination problem as mentioned above.

BRIEF SUMMARY OF THE INVENTION

Accordingly, it is the primary object of the present invention to provide a stress-free lead frame having a stress-relief and an interlocking means for eliminating delamination of leads during packaging.

It is another object of the present invention to provide a stress-free lead frame having a stress-relief means that can be produced using existing moulding machine.

It is yet another object of the present invention to provide a stress-free lead frame having a stress-relief means that is of simple design for easy production.

These and other objects of the present invention are accomplished by,

A stress-free lead frame (1) comprising;

a plurality of integrated circuits areas (11), each of said plurality of integrated circuit areas having a die pad (12) and a plurality of leads (13); and a peripheral pad (14) surrounding said plurality of integrated circuit areas, said peripheral pad (14) being provided with a plurality of stress-relief means (15).

BRIEF DESCRIPTION OF THE DRAWINGS

Other aspect of the present invention and their advantages will be discerned after studying the Detailed Description in conjunction with the accompanying drawings in which.

DETAILED DESCRIPTION OF THE INVENTION

Figure 1:
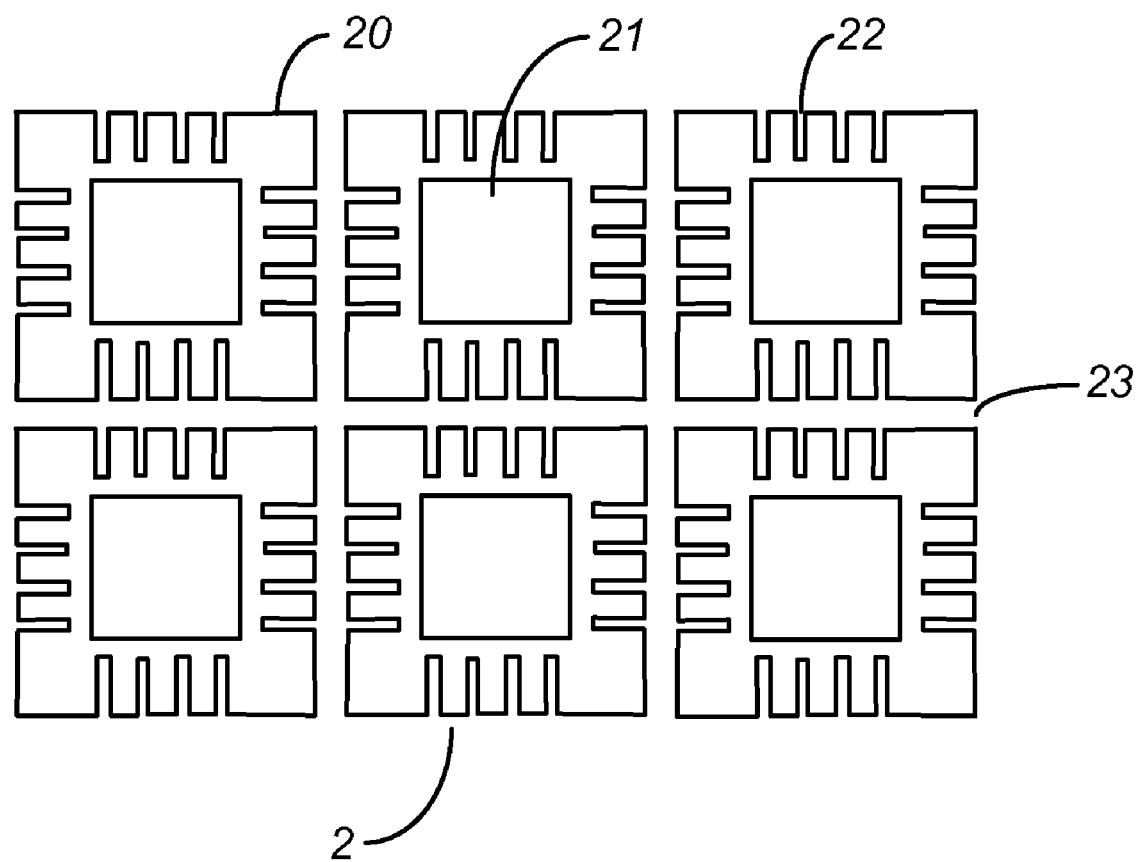
FIG. 1 showing a lead frame of the prior art having a multiple integrated circuit units.

Referring now to FIG. 1 showing a lead frame of the prior art having a multiple integrated circuit units. A lead frame (2) of the prior art consists of a plurality of integrated circuits (20), each having a die pad (21) and a plurality of leads (22) projecting outwardly from the die pad (21). The integrated circuits (20) are connected together by connecting bars (23). At the outer periphery of the lead frame (2), there is an inactive portion of the lead frame (2) called a peripheral pad (not shown). When the lead frame (2) is moulded to form the MLP, about half of the peripheral pad is left unmoulded causing different expansions and thus delamination to the plurality of leads (22) adjacent to the peripheral pad.

Figure 2:
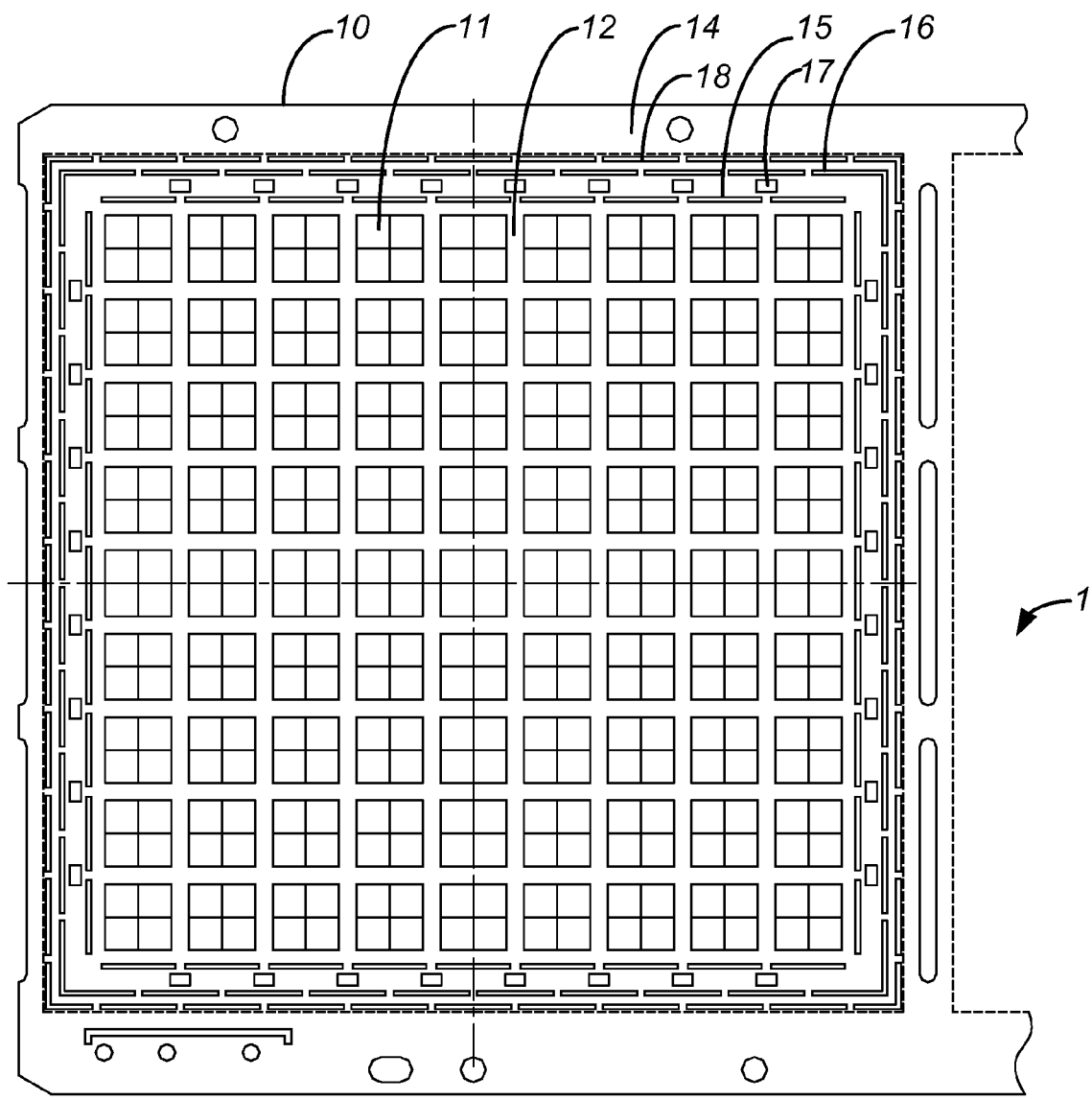
FIG. 2 showing a stress-free lead frame having a stress-relief means according to one embodiment of the present invention.

Referring to FIG. 2 showing a stress-free lead frame having a stress-relief means according to one embodiment of the present invention. The stress-free lead frame (1) comprises a lead frame (10) having a plurality of integrated circuit areas or integrated circuits (11) joined together by connecting bars (12). Each of the integrated circuits (11) has a plurality of die pads (not shown) and leads (not shown) projecting outwardly from the die pads. A peripheral pad (14) surrounds the lead frame (10).

The lead frame (10) is preferably of a metallic foil base, like copper or other suitable materials. The metallic foil is either etched or stamped to form the lead frame (10) that contain a plurality of integrated circuits (11). Each of the integrated circuit (11) has a die pad (not shown) for attaching a die and a plurality of leads (not shown) projecting away from the die pads. The lead frame (10) is surrounded by a peripheral pad (14) that is an inactive part of the metallic foil. The peripheral pad (14) is provided with a plurality of stress-relief means and a plurality of interlocking means in the form of holes and slots. Extensive research and experimentation has revealed that for best result, at least three rows of stress-relief means, a first row (15), a second row (17) and a third row (18), and a row of interlocking means (16) are needed. The first and the third row of the stress-relief means (15 and 18 respectively) are provided with slots while the second row (17) is provided with holes, preferably square hole. The holes and slots are arranged side by side in equal intervals for equal expansion and compression distribution. For the interlocking means (16), a plurality of slots are arranged at equal intervals in between the second and the third row of the stress-relief means (17 and 18 respectively).

During moulding, the lead frame (10) and the peripheral pad (14) containing the stress-relief means (15) and the interlocking means (16) is moulded to form the MLP. The heat produced during this process causes the leads to expand and to compress when cooled. In prior art practice, this produces delamination that causes many of the resulting integrated circuits a reject. However, the provision of the stress-relief means (15) can easily accommodate the expansion and compression of the leads. Further, the interlocking means (16) holds firmly the lead frame (10) to the moulded epoxy thus eliminating altogether delamination in the leads caused either by expansion and contraction of the metal lead frame or during handling of the MLP.

While the preferred embodiment of the present invention and their advantages have been disclosed in the above Detailed Description, the invention is not limited thereto but only by the spirit and scope of the appended claim.

What is claimed is:

1. A lead frame strip for use in making an integrated circuit die package, the lead frame strip comprising:
   an outer frame;
   a plurality of horizontal and vertical connecting bars attached to the outer frame and defining a plurality of inner frames arranged in a matrix pattern within the outer frame, each inner frame comprising a die pad and a plurality of tabs spaced apart from and arranged around the die pad, wherein the plurality of regularly-spaced openings do not extend along the horizontal or vertical connecting bars attached to the outer frame;
   a plurality of regularly-spaced openings around a circumference of the outer frame in two or more rows; and
   a plurality of positioning holes along an outer portion of the outer frame.

2. The lead frame strip of claim 1 wherein the plurality of regularly spaced openings comprises first and second rows of elongated openings arranged around the circumference of the outer frame.

3. The lead frame strip of claim 2 wherein the first and second rows of elongated openings are staggered such that ends of openings in the first row do not align with ends of openings in the second row.

4. The lead frame strip of claim 1 wherein the plurality of regularly spaced openings arranged around the circumference of the outer frame comprises a row of non-elongated holes and at least one row of elongated openings.

5. The lead frame strip of claim 4 wherein the non-elongated holes comprise square holes.

6. The lead frame strip of claim 4 wherein the non-elongated holes are aligned with gaps between adjacent elongated openings in the at least one row of elongated openings.

7. The lead frame strip of claim 3 wherein the plurality of regularly-spaced openings comprises first and second rows of elongated openings and a row of non-elongated holes.

8. The lead frame strip of claim 7 wherein the row of non-elongated holes is positioned between the first and second rows of elongated openings.

9. The lead frame strip of claim 3 wherein the plurality of regularly spaced openings arranged around the circumference of the outer frame comprises a row of non-elongated holes and first, second and third rows of elongated openings.

10. The lead frame strip of claim 9 wherein the first and second rows of elongated openings are staggered such that ends of openings in the first row do not align with ends of openings in the second row.

11. The lead frame strip of claim 10 wherein the first and third rows of elongated openings are aligned so that most of the ends of openings in the first row align with ends of openings in the third row.

* * * * *